United States Patent
Fucili et al.

[11] Patent Number: 5,859,608
[45] Date of Patent: *Jan. 12, 1999

[54] SUCCESSIVE APPROXIMATION AND SHIFT REGISTER WITHOUT REDUNDANCY

[75] Inventors: Giona Fucili, Magenta; Lorenzo Papillo, Milan; Andrea Pasquino, Vimercate; Annamaria Rossi, Genoa; Alberto Gola, Broni, all of Italy

[73] Assignee: SGS-Thomson Microelectronics S.r.l., Agrate Brianza, Italy

[*] Notice: This patent issued on a continued prosecution application filed under 37 CFR 1.53(d), and is subject to the twenty year patent term provisions of 35 U.S.C. 154(a)(2).

[21] Appl. No.: 722,377

[22] Filed: Sep. 30, 1996

[30] Foreign Application Priority Data

Sep. 29, 1995 [EP] European Pat. Off. .............. 95830409

[51] Int. Cl.[6] ................................................ H03M 1/34
[52] U.S. Cl. ........................... 341/165; 341/122; 341/161
[58] Field of Search .................................. 341/161, 162, 341/163, 164, 165, 121

[56] References Cited

U.S. PATENT DOCUMENTS

| | | | |
|---|---|---|---|
| 4,553,128 | 11/1985 | Pilost | 341/161 |
| 4,688,018 | 8/1987 | Vaughn | 341/161 |
| 4,829,302 | 5/1989 | Oitzl et al. | 341/165 |
| 4,851,838 | 7/1989 | Shier | 341/121 |
| 4,852,130 | 7/1989 | Draxelmayr | 377/81 |
| 4,940,981 | 7/1990 | Naylor et al. | 341/161 |
| 5,061,926 | 10/1991 | Washiyama | 341/164 |
| 5,589,832 | 12/1996 | Grundvig et al. | 341/161 |

FOREIGN PATENT DOCUMENTS 0258840  8/1987  European Pat. Off. .

*Primary Examiner*—Jeffrey Gaffin
*Assistant Examiner*—Kim Huynh
*Attorney, Agent, or Firm*—Allen, Dyer, Doppelt, Milbrath & Gilchrist, P.A.

[57] ABSTRACT

A successive approximation shift register without redundancy for a finite-state machine of the sequential type, is also effective to store the machine states. The shift register comprises a chain of logic circuits of the bistable type (FF0,FF1, . . . ) having an input stage with selectable signal inputs which are feedback connected through logic OR gate circuits (OR0,OR1, . . . ,OR6).

4 Claims, 5 Drawing Sheets

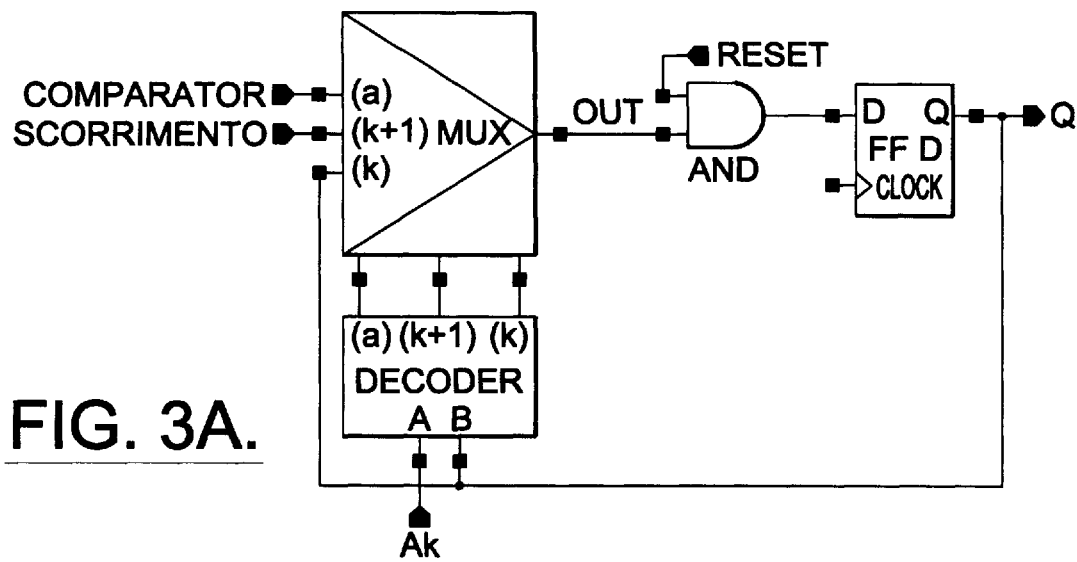
FIG. 3A.
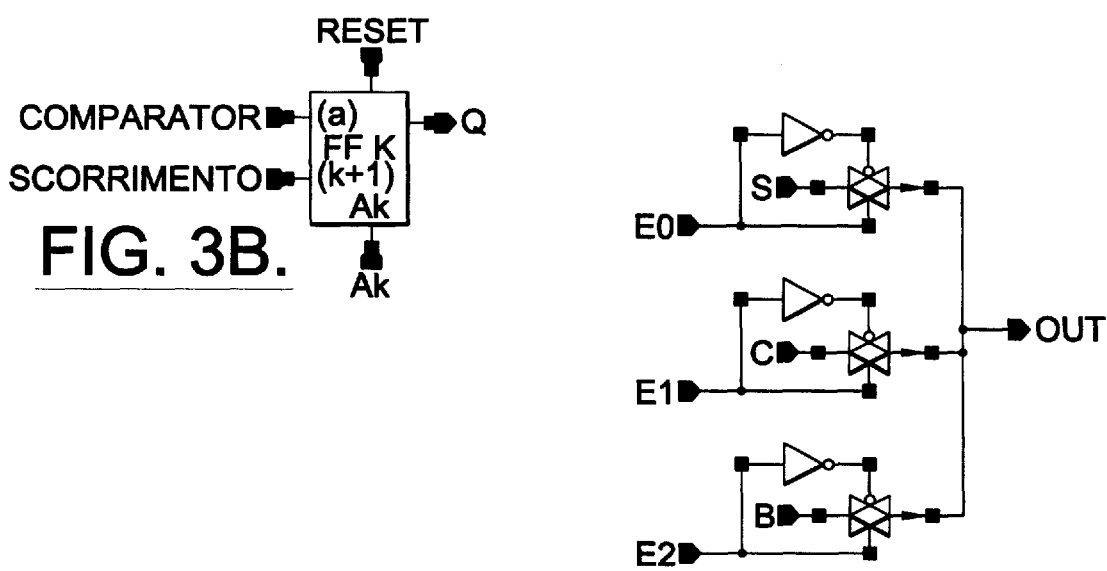
FIG. 3B.
FIG. 4.
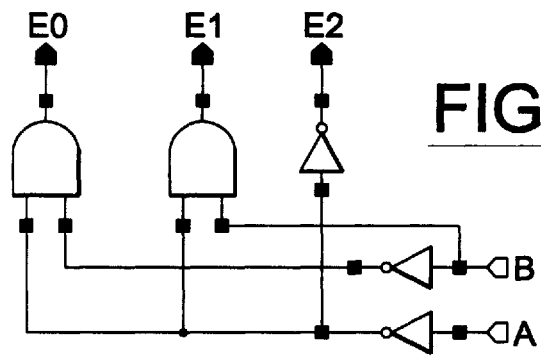
FIG. 5.

SUCCESSIVE APPROXIMATION AND SHIFT REGISTER WITHOUT REDUNDANCY

CROSS-REFERENCE TO RELATED APPLICATION

This application claims priority from European 95830409.9, filed Sep. 29, 1995, which is hereby incorporated by reference. However, the content of the present application is not necessarily identical to that of the priority application.

BACKGROUND AND SUMMARY OF THE INVENTION

This invention relates to analog-to-digital converters (abbreviated to A/D converters or ADCs), in particular A/D converters which operate in accordance with the successive approximation (S/A) method.

Analog-to-digital converters are essential elements to many integrated circuit applications, such as automatic control, adjustment, data acquisition, and data processing systems, wherein they provide "interfaces" for converting analog entities (real-word parameters) into digital information adapted to be processed through logic circuits, memories, and microprocessors.

Analog-to-digital converters of the successive approximation type are the more widely used ones because they combine good speed of execution (200 to 500 ns per bit) with low cost, ease of fabrication (a single LST chip), and good accuracy; state-of-art embodiments of such converters being capable of handling up to 12 bits.

A/D converters of the S/A type are standard items in the lines offered by all major suppliers of semiconductors.

Examples of their construction can be found in "Data Acquisition Databook", 1993 Edition, National Semiconductor, which is hereby incorporated by reference.

The architecture of a successive approximation analog-to-digital converter usually comprises a comparator, a digital-to-analog (D/A) converter, and a control logic, as shown in FIG. 1. The control logic is often referred to as the Successive Approximation Register (SAR). The SAR is operative to determine the value of each bit in a sequential manner, according to the comparator output. The SAR starts the conversion cycle by putting the most significant bit, MSB, of the word equal to 1, and all the other bits equal to 0 (attempt). This digital word is applied to the D/A converter, which will generate an analog signal whose value is one half the conversion range Vref/2 which is being compared to the input Vin. If the comparator output is high, the control logic will set the MSB to 1, whereas if the output is low, the control logic will set the MSB to 0 (decision). At this stage, the value of the MSB has been determined. The approximation process continues with the application of a digital word to the D/A converter wherein the MSB has its proper value and the second or attempt bit is 1 and all the remaining bits are 0. Once again, the output from the D/A is compared to its input: if the comparator output is high, the second bit is set to 1, otherwise to 0, and so on to the least significant bit, LSB, of the word.

The contents of the SAR register represent the digital outcome of the completed conversion.

The SAR is a sequential finite-state machine (MSF) which generates the sequence of states shown in the following chart (wherein the case of the number of bits being N=8 has been considered, for simplicity).

The sequence evolves as follows through the chart: in step 1, the initializing configuration is enforced. Over the following steps, three actions are possible on the single bit: enforcement of the attempt 1, result of the decision from the comparator, memory of the preceding value.

| Step: | D/A input word | | | | | | | | Comparator output |
|---|---|---|---|---|---|---|---|---|---|
| 0 | 1 | 0 | 0 | 0 | 0 | 0 | 0 | 0 | a7 |
| 1 | a7 | 1 | 0 | 0 | 0 | 0 | 0 | 0 | a6 |
| 2 | a7 | a6 | 1 | 0 | 0 | 0 | 0 | 0 | a5 |
| 3 | a7 | a6 | a5 | 1 | 0 | 0 | 0 | 0 | a4 |
| 4 | a7 | a6 | a5 | a4 | 1 | 0 | 0 | 0 | a3 |
| 5 | a7 | a6 | a5 | a4 | a3 | 1 | 0 | 0 | a2 |
| 6 | a7 | a6 | a5 | a4 | a3 | a2 | 1 | 0 | a1 |
| 7 | a7 | a6 | a5 | a4 | a3 | a2 | a1 | 1 | a0 |
| result | a7 | a6 | a5 | a4 | a3 | a2 | a1 | a0 | — |

The successive approximation algorithm whereby one can describe the chart is the following. Taking any conversion step whichever, the next step value for each bit k of the input word to the D/A can have one of three values:

that of the left side bit (k+1), if all the bits (k−1, k−2, ..., 0) which are less significant than the bit k, and the bit k itself, have "0" value; or that of the comparator output, if all the least significant bits of the word have the value of "0" and the bit k carries a value of "1" or that of the bit k, if at least one of the least significant bits carries a value of "1".

By running this algorithm over a suitable logic network, the same storage elements (flip-flops) that hold the result of the conversion can be used to encode the $2^N$ possible states of the finite-state machine MSF. In fact, where an N-bit successive approximation A/D converter is to be provided, the skilled artisan will find that the MSF machine on which the algorithm is to be run requires at least $2^N$ states, that is at least N flip-flops.

However, current embodiments of registers for successive approximation analog-to-digital converters employ a number of flip-flops which is at least twice as large as the minimum.

The underlying technical problem of this invention is to provide a no-redundancy register for successive approximation analog-to-digital converters.

This problem is solved by a shift register of the type indicated above and as defined in the claims appended to this specification.

The features and advantages of a shift register according to the invention will be apparent from the following description of an embodiment thereof, given by way of example and not of limitation with reference to the accompanying drawings.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 3A shows in block diagram form the basic elements for a shift register, according to the invention, and showing a logic gate connected between the selection circuit and flip flop;

FIG. 3B is a block circuit illustrating how the contents of an FFk have the reset signal;

FIG. 4 is a circuit diagram for the possible implementation of a selection circuit;

FIG. 5 is a circuit diagram for a possible implementation of a decoding circuit.

DETAILED DESCRIPTION OF THE PREFERRED EMBODIMENTS

Figure 2:
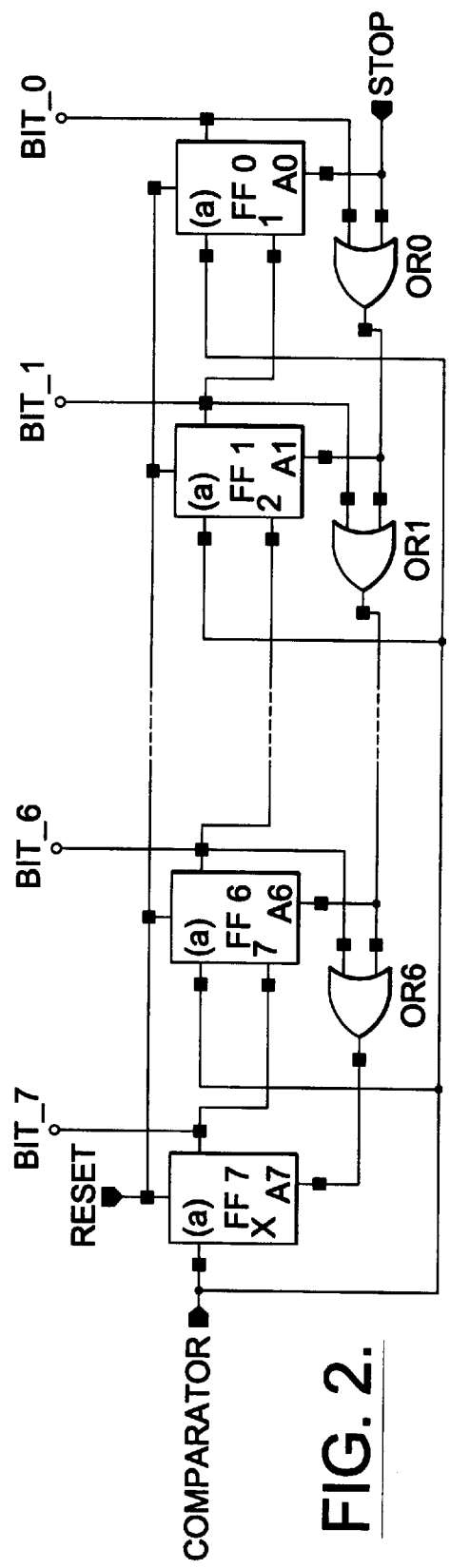
FIG. 2 shows diagrammatically a sequential logic network used in the construction of a shift register according to the invention.

The numerous innovative teachings of the present application will be described with particular reference to the presently preferred embodiment (by way of example, and not of limitation), in which:

The sequential logic network shown diagrammatically in FIG. 2 covers a situation where digital words of 8 bits are used.

Accordingly, it comprises eight bistable circuits as depicted in FIG. 3B FF0–FF7, and forms the inventive shift register without redundancy which, in a successive approximation type of analog-to-digital converter, functions as a control logic between the comparator circuit and the digital-to-analog converter.

Omitted from FIG. 2, for simplicity of illustration, are the connections for the clock signal, which is common for all the flip-flops.

Each of these bistable circuits has first and second input terminals for digital signals, a reset terminal, a selection terminal $A_k$ (where k=0, 1, . . . , 7), and an output terminal.

Through the first terminal, signals from the comparator are propagated, when the sequential logic network is used in a successive approximation analog-to-digital converter.

It should be noted, however, that a shift register without redundancy according to the invention may be applied to any systems, so long as these operate on a successive approximation method using the algorithm just described.

Only the input bistable circuit FF7 is without the second input terminal, and the second input terminal (for "shift" signals) of each of the other bistable circuit is connected to the output terminal of the bistable circuits immediately preceding it.

Figure 1:
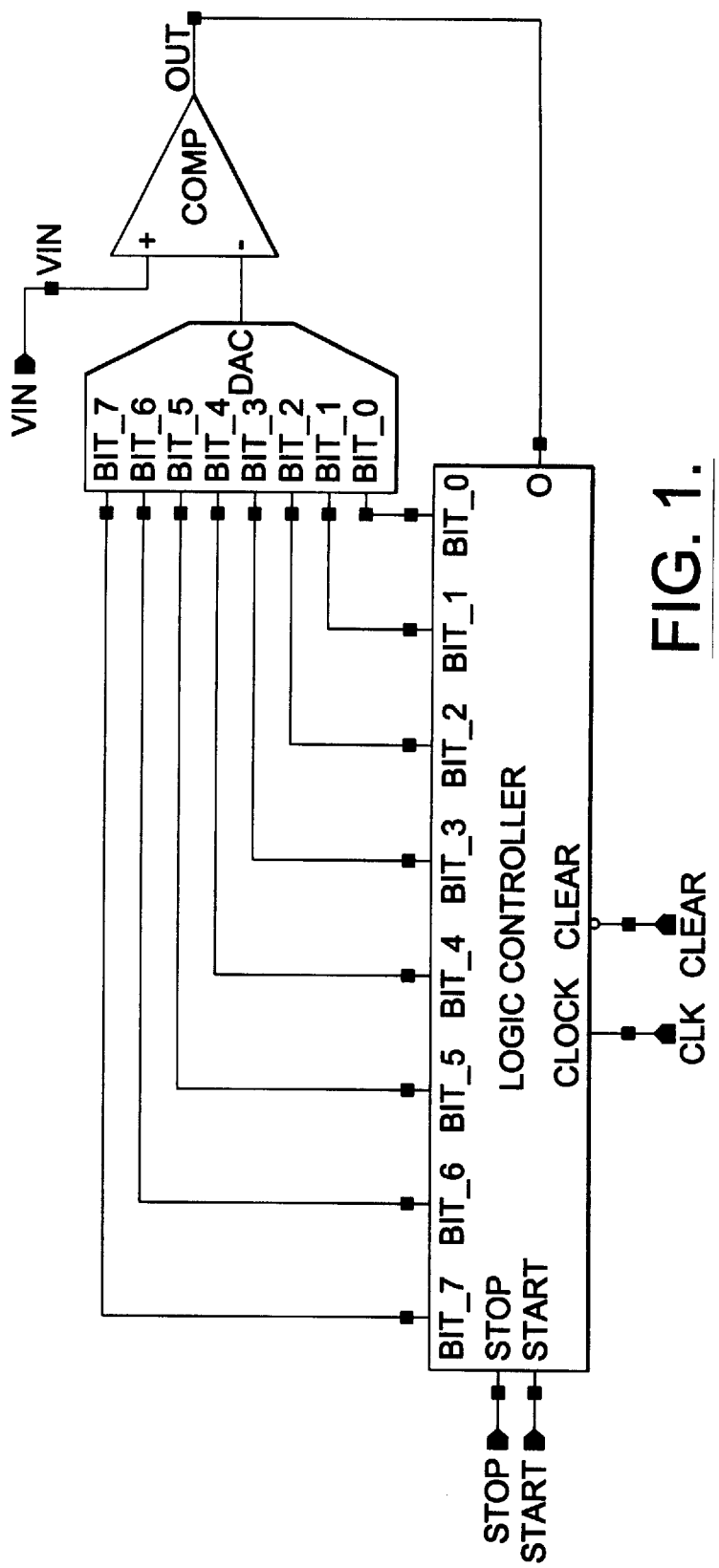
FIG. 1 shows a schematic diagram of a successive approximation A/D converter.

These output terminals correspond to the output terminals BIT_7, . . . , BIT_0 of the control logic shown in FIG. 1, and therefore, in an A/D converter, they would be connected to the inputs of the D/A converter included in the A/D converter. In accordance with the invention, respective logic gate circuit, OR6, . . . , OR0 (of the OR type as shown) are connected to the bistable circuit FF7, FF6, . . . , FF1 which are each provided with an output terminal connected to the selection terminal Ak (where k=7, . . . , 1) of the respective bistable circuit, a first input terminal connected to the output terminal of the next bistable circuits and a second input terminal connected (with the exception of OR0) to the output terminal of the logic gate circuit just ahead of it in the feedback chain.

The second input terminal of the logic gate circuit OR0 and the selection terminal of the bistable circuit FF0 are connected to a generator of a stop signal STOP, not illustrated, once the conversion is completed.

Figure 7:
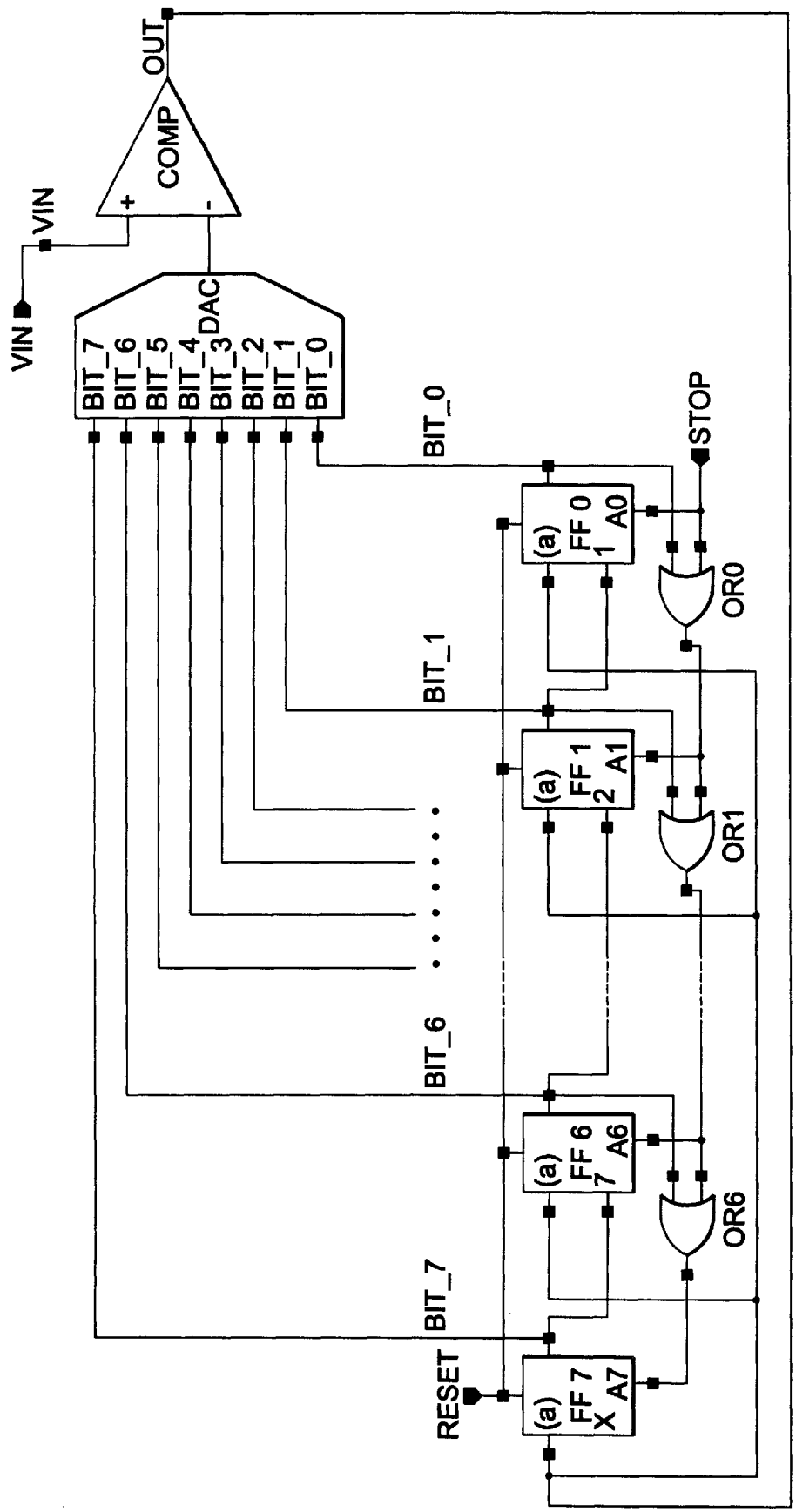
FIG. 7 shows a schematic diagram of a successive approximation A/D converter which consists of the sequential logic network according to the invention.

FIG. 7 shos the internal construction of a successive approximation A/D converter according to the invention which consists of a DAC, a comparator (COMP), and a sequential logic network as depicted in FIG. 2. The sequential logic network comprises the chain of bistable circuits FFk.

Shown in FIG. 3A is the internal construction of a generic element FFk as depicted in FIG. 3B in the chain of bistable circuit of the shift register.

This comprises, in the example, a flip-flop of the D type having its input terminal coupled to the output terminal of a selection circuit or multiplexer MUX, which has first and second input terminals for connection to the comparator of the analog-to-digital converter and to the preceding flip-flop, respectively.

The bistable circuit FF7 has a multiplexer with the second input terminal unconnected or omitted altogether.

As shown in FIG. 3A, the output terminal of the D-type bistable circuit, forming the output terminal of the generic bistable circuit FFk, is connected to both a third input terminal of the selection circuit MUX and an input terminal B of a decoding circuit DECODER which has another input terminal A being the selection terminal of the bistable circuit FFk.

The decoding circuit is connected to the selection circuit MUX by control connections which would be dependent on the specific implementation of the circuit blocks.

FIG. 4 shows a diagram for a possible circuit implementation of the multiplexor selection circuitry depicted in FIG. 3A. Connections E0, E1, and E2 correspond to the control connections of the decoder and are used to select inputs a, k+1, and k respectively.

FIG. 5 shows a diagram for a possible circuit implementation of the decoder circuitry depicted in FIG. 3A. Control connections E0, E1, and E2 correspond to the connections of the multiplexor and are used to select a, when input A is "1", k+1, when input B is "1", and k, when neither input is "1".

Figure 6:
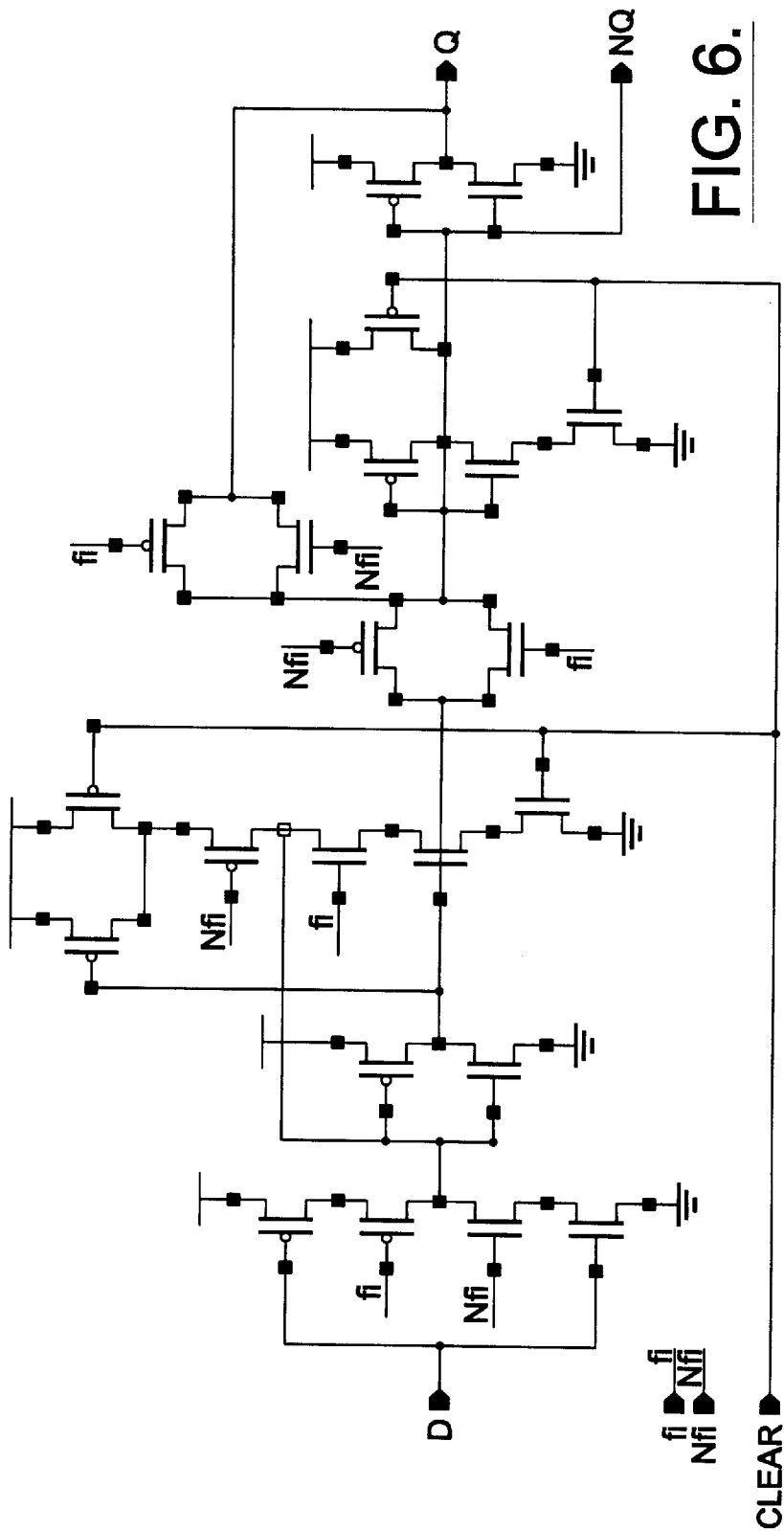
FIG. 6 is a circuit diagram for the possible implementation of a D-type flip flop.

FIG. 6 shows a diagram for a possible circuit implementation of the D-type flip-flop circuitry depicted in FIG. 3A. Input connections fi and Nfi occur at several places in the depicted implementation. They are noted for convenience in the lower left corner of the figure.

In FIG. 3A, a logic gate of the AND type is connected between the selection circuit and the D-type flip-flop, which AND gate enables synchronous operation with a reset signal.

Synchronous operation could also be achieved without the AND gate, using a clear signal for the flip-flop instead.

The basic configuration of the finite-state machine just described is that of a shift register with multiplexed inputs. For the first state, a special signal is arranged to impose the initializing configuration, that is, the first bistable circuits (MSB or Most Significant Bit) will take a preset state, and the others a reset state. FIG. 3B illustrates an example of how the contents of an FFk can be forced synchronously to the value of "0" by the reset signal.

From what has been stated in the preceding paragraph in relation to possible values of each bit, it is evinced that each FFk should be allowed to choose from three data inputs as respectively being the output of the left side FFk (k+1), the output of the comparator (a), or the output of the FFk itself. By having a MUX connected to the input, the three inputs can be selected using a suitable decoding logic.

Once FFk which contains the bit k is given, the sequence of all zeroes in the least significant bits (k−1, k−2, . . . , 0) will be detected through a chain of OR gates between the outputs of the FFs which contain them. The decoding logic of the MUX associated with the bistable circuit FFk has, as its inputs, the outputs from the OR gates of the previous bistable (Ak) and the output from the bistable circuits itself (B) (current value of the FF), as shown in the following chart:

| A | B | (k) | (a) | (k + 1) |
|---|---|-----|-----|---------|
| 1 | — | 1   | 0   | 0       |
| 0 | 1 | 0   | 1   | 0       |
| 0 | 0 | 0   | 0   | 1       |

To complete the A/D converter, the signals which start and stop the conversion require to be managed. As the start signal, the reset signal may be used, while to "freeze" the contents of the bistable circuits, the stop signal input to the first OR gate in the chain should be driven high. This signal may be derived from the output of an additional bistable circuits which is reading the output from the last bistables (LSB or Least Significant Bit).

During the cycle when the value of the LSB is decided upon, the additional bistable circuit will read a "1" and activate the stop signal (obviously, this bistable circuit also requires to be reset during the reset step).

The control could be managed separately, however, if a finite-state machine is regarded as split into two separate portions, namely an Operating Unit and a Control Unit.

From the constructional standpoint, a compounded finite-state machine consists of a combination of plain finite-state machines and sequential functional blocks. The working portion is that described earlier herein, which generates the sequence of states shown in the chart, and the control portion is a plain finite-state machine which times the conversion start and end (manages the start and stop signals).

Another possibility would be, of course, that of controlling the steps by means of a microprocessor.

It should be understood that modifications, integrations and substitutions of elements may be made unto the embodiment described in the foregoing, without departing from the protection scope of the following claims.

For example, the logic OR gates could be replaced with equivalent gates of the NAND type in conformity with known rules.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

What is claimed is:

1. A successive-approximation N-bit, analog-to-digital converter, comprising:

a digital-to-analog converter, having an N-bit digital input and an analog output which depends on data received at said digital input;

a comparator, connected to receive an external analog signal and also said analog output from said digital-to-analog converter, and to generate an output signal therefrom; and N bistable circuits, each having a multiplexing circuit, and a single corresponding flip-flop, and each connected to provide one bit of output to a respective one of said digital inputs of said converter, and each connected to receive said output signal from said comparator, and including a logic gate connected between the multiplexing circuit and the single, corresponding flip-flop to enable synchronous operation with a reset signal;

wherein said bistable circuits are mutually interconnected to implement a finite state machine function which forces said N-bit digital input of said digital-to-analog converter toward an N-bit value which corresponds to analog-to-digital conversion of said external analog value.

2. The successive-approximation analog-to-digital converter of claim 1, wherein said bistable circuits each comprise clocked logic.

3. The successive-approximation analog-to-digital converter of claim 1, wherein said bistable circuits all comprise respective clocked flip-flops which are connected to be clocked in synchrony.

4. The successive-approximation analog-to-digital converter of claim 1, wherein, in multiple ones of said bistable circuits, one of said digital input connections is selected in dependence on respective select bits which are partially dependent on an output of said bistable circuit and partially dependent on an output of a neighboring one of said bistable circuits.

* * * * *

UNITED STATES PATENT AND TRADEMARK OFFICE
CERTIFICATE OF CORRECTION

PATENT NO. : 5,859,608
DATED : January 12, 1999
INVENTOR(S) : Fucili et al.

It is certified that error appears in the above-identified patent and that said Letters Patent is hereby corrected as shown below:

On the title page, Item [75] delete the following inventor & insert the, following:

Delete: "Annamaria Rossi, Genoa;" and insert --Annamaria Rossi, Genova,--

Column 3, line 66: Delete "FIG. 7 shos the internal construction of a successive"

Insert: --FIG. 7 shows the internal construction of a successive --

Signed and Sealed this

First Day of June, 1999

Attest:

Attesting Officer

Q. TODD DICKINSON

Acting Commissioner of Patents and Trademarks